United States Patent
Moskalev

(10) Patent No.: US 10,211,600 B2
(45) Date of Patent: Feb. 19, 2019

(54) HIGH POWER CW MID-IR LASER

(71) Applicant: IPG PHOTONICS CORPORATION, Oxford, MA (US)

(72) Inventor: Igor Moskalev, Birmingham, AL (US)

(73) Assignee: IPG PHOTONICS CORPORATION, Oxford, MA (US)

( * ) Notice: Subject to any disclaimer, the term of this patent is extended or adjusted under 35 U.S.C. 154(b) by 0 days.

(21) Appl. No.: 15/557,916

(22) PCT Filed: Mar. 23, 2016

(86) PCT No.: PCT/US2016/023778
§ 371 (c)(1),
(2) Date: Sep. 13, 2017

(87) PCT Pub. No.: WO2016/154309
PCT Pub. Date: Sep. 29, 2016

(65) Prior Publication Data
US 2018/0054042 A1 Feb. 22, 2018

Related U.S. Application Data

(60) Provisional application No. 62/137,070, filed on Mar. 23, 2015.

(51) Int. Cl.
*H01S 5/347* (2006.01)
*H01S 3/08* (2006.01)
*H01S 3/094* (2006.01)
*H01S 3/102* (2006.01)
*H01S 3/16* (2006.01)
*H01S 3/042* (2006.01)
*H01S 3/06* (2006.01)
*H01S 3/04* (2006.01)

(52) U.S. Cl.
CPC .............. *H01S 5/347* (2013.01); *H01S 3/042* (2013.01); *H01S 3/0408* (2013.01); *H01S 3/0602* (2013.01); *H01S 3/0604* (2013.01); *H01S 3/08072* (2013.01); *H01S 3/094042* (2013.01); *H01S 3/1026* (2013.01); *H01S 3/162* (2013.01); *H01S 3/1623* (2013.01); *H01S 3/1628* (2013.01); *H01S 3/0608* (2013.01)

(58) Field of Classification Search
CPC .... H01S 5/347; H01S 3/0602; H01S 3/08072; H01S 3/042; H01S 3/0408; H01S 3/1026; H01S 3/094042; H01S 3/162
See application file for complete search history.

(56) References Cited

U.S. PATENT DOCUMENTS 4,567,597 A * 1/1986 Mandella .............. H01S 3/0401
372/34
5,818,628 A * 10/1998 Clark ...................... H01S 3/042
359/333

(Continued)

OTHER PUBLICATIONS

Basu, "Disk motion—a new control element in high brightness solid state laser design", Optics Express, vol. 12, No. 14, Jul. 2004.*

*Primary Examiner* — Xinning(Tom) Niu
(74) *Attorney, Agent, or Firm* — Yuri B. Kateshov, Esq.; Timothy J. King, Esq.

(57) ABSTRACT

The present invention provides a rotating chalcogenide gain media ring to provide un-precedented power generation with minimal thermal lensing for CW lasing in the mid-IR spectrum.

9 Claims, 5 Drawing Sheets

(56) References Cited

U.S. PATENT DOCUMENTS

| | | | | |
|---|---|---|---|---|
| 5,867,324 A | * | 2/1999 | Kmetec | ............... G02B 27/09 |
| | | | | 359/625 |
| 7,848,382 B2 | * | 12/2010 | Weida | ............... G01N 21/3504 |
| | | | | 372/102 |
| 2005/0224212 A1 | * | 10/2005 | East | ............... B23K 20/02 |
| | | | | 165/80.4 |
| 2012/0224599 A1 | * | 9/2012 | Mirov | ............... C30B 31/00 |
| | | | | 372/49.01 |

* cited by examiner

HIGH POWER CW MID-IR LASER

SUMMARY OF THE DISCLOSURE

Field of the Disclosure

This disclosure relates to continuous wave (CW) mid-IR solid state lasers. Particularly, the present invention provides a rotating disk and more preferably a ring comprised of chalcogenide gain media selected from II-VI group of polycrystalline materials doped with transition metal ions to provide un-precedented power generation with minimal thermal lensing.

Prior Art

Middle-infrared (mid-IR) laser sources operating in the 2-10 μm spectral range are in great demand for a variety of defense related applications including: free space communication, countermeasures, remote sensing, as well as industrial process control and medical applications. Recent progress in optically pumped lasers based on Cr and Fe doped II-VI wide band semiconductors enabled access to high output powers in the 1.9-5 μm spectral range. The spectroscopic characteristics of the transition metal (TM) doped II-VI materials and their applications for mid IR solid state lasers were reported in several reviews[i,ii,iii,iv,v]. In this patent application, a completely novel optical schematic is disclosed which provides unprecedented power scaling of Cr:ZnSe-derived CW laser light.

Power scaling of Cr2+:ZnS/Se lasers is of extreme interest for numerous applications in industrial, medical, material processing, and defense applications. For successful applications of these mid-IR lasers it is especially important to reach multi-tens and hundreds of Watts of output power near 2940 nm output wavelength where most medical applications reside. The output wavelengths near the gain maximum of these materials (2.4 μm) are also of a very high interest for material processing applications where high throughput is especially important, such as the processing of polymers.

We have recently reported on obtaining up to 20 W of output power at 2.4 μm and up to 3 W at 2940 nm in the mid-IR laser systems based on conventional slab geometry of gain elements[i]. Unfortunately, due to extremely high thermo-optical coefficients of Cr:ZnSe and Cr:ZnS gain media leading to strong thermal lensing effects, those laser systems suffer from poor beam quality at high pump power levels and operate close to optical damage thresholds, leading to high likelihood of laser failures. MOPA (Master Oscillator Power Amplifier) and multi-element configurations of gain media help to mitigate these challenges to some extent but do not provide a reliable and definitive solution due to increased systems' complexity.

Our experience with these lasers shows that our most recently demonstrated results represent the practical limits for the output powers of Cr:ZnS and Cr:ZnSe laser systems based on conventional resonator setups.

What are needed are novel optical schematics that allow for much higher power to satisfy the needs of medical applications and material processing in the mid-IR spectrum.

SUMMARY OF THE INVENTION

The above articulated needs are satisfied by the disclosed CW mid-IR laser configured with a rotating chalcogenide gain medium, such as TM doped II-VI materials, because the thermal lensing is avoided. Our core idea is to scan the matched coaxial pump beam and laser mode through a rotating gain element in the form of a ring.

Unexpected power output almost seven (7) times for 2400 nm central wavelength and ten (10) times for 2940 nm central wavelength that of the prior art provide an optical regime that can have many uses.

More particularly, the present invention provides a continuous wave ("CW") mid-IR laser comprising: a resonant cavity; a gain medium selected from polycrystalline transition metal doped II-VI materials ("TM:II-VI"), the gain medium being formed into a disk a more preferably a ring defined by an inner and outer circumference and upstream and downstream faces with a portion of the upstream and downstream faces being positioned within the resonant cavity; a pump source; and a motor to which the ring is mounted. It follows that the portion of the ring being in the resonant cavity receives pump light sufficient to emit a CW laser beam at a wavelength in the mid-IR spectrum.

In preferred embodiments, the TM:II-VI gain media is Cr:ZnS or Cr:ZnSe.

In other embodiments, the CW laser of the present invention will have one or more faces of the gain media have a reflective coating fixed thereto.

In other embodiments, no reflective coatings will be necessary.

In other embodiments, the gain media will be at normal incidence to the pump light whereas in other embodiments it will be at a Brewsters angle of incidence.

In preferred embodiments of the above paragraphs, the ring of the present invention will further include a heat sink positioned within its internal circumference or a heat sink positioned on its external circumference or both.

In preferred embodiments of the above paragraphs and in particular paragraph 13, a foil will be interposed between any heat sink positioned on a circumference.

BRIEF DESCRIPTION OF THE DRAWINGS

The above and other aspects, features and advantages of the disclosure will become more readily apparent from the following drawings, in which:

FIG. 3a is a face view showing the relationship between the inner and outer diameter of the chalcogenide gain media of the present invention;

FIG. 3b is a side view of the ring of FIG. 3a; and

FIG. 3c is a three dimensional rendering of the ring of FIG. 3a.

SPECIFIC DESCRIPTION

Figure 1:
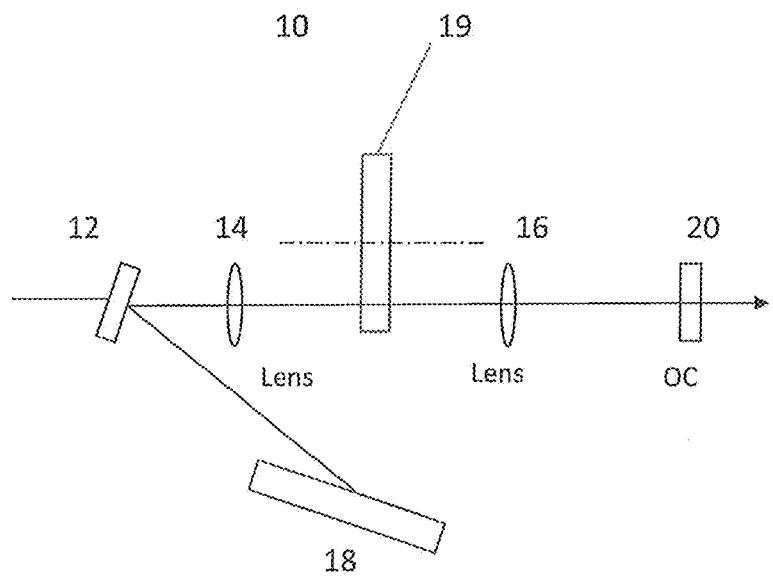
FIG. 1 is one exemplary optical schematic of the CW mid-IR laser of the present invention.

Reference will now be made in detail to embodiments of the invention. Wherever possible, same or similar numerals are used in the drawings and the description to refer to the same or like parts or steps. The drawings are in simplified form and are not to precise scale. Unless specifically noted, it is intended that the words and phrases in the specification and claims be given the ordinary and accustomed meaning to those of ordinary skill in the diode and liber laser arts. The word "couple" and similar terms do not necessarily denote direct and immediate connections, but also include mechanical and optical connections through free space or intermediate elements.

In this work we report our first results on obtaining record output powers of CW Cr2+:ZnSe laser systems which are based on an entirely new approach for gain element configurations. The key idea of our novel approach is based on the fact that thermal lensing is caused by average pump power absorbed by the gain media within a small volume of the gain element where pumping and lasing occur. In contrast to pure CW systems, Cr2+:ZnS/Se QCW lasers with low pump duty cycles and gain-switched laser systems do not suffer from thermal lensing effects and can withstand extremely high peak powers of pump radiation while showing very high lasing efficiency and delivering superior output beam quality.

Therefore, we can obtain high CW output power and avoid thermal lensing effects if we find a method of coherent beam combining of large number of high-peak power QCW laser systems. The straightforward approach to implement this idea is to continuously shift the gain elements across the pump beam with sufficiently high speed. In this case, every region of the gain element located in the path of the pump beam spot will be subjected to the pumping conditions similar to those in QCW laser systems, but the system as a whole will demonstrate pure CW output because no gaps between the pump regions are present. Our proposed solution to realize infinite motion is to use a large spinning ring gain element.

Unlike the rotating disk of U.S. Pat. No. 7,593,447, we proposed a structure that is distinguished therefrom by being in the form of a ring that is further distinguished by being comprised of a TM:II-VI gain media. Also unlike the rotating disk of U.S. Pat. No. 7,593,447, heat is removed at substantially every surface of the entire gain element, thereby reducing and minimizing the heat energy injected into the active region of the gain element while increasing the injected optical energy A generic experimental setup of our "proof of concept" laser system is shown in FIG. 1. FIG. 1 provides a generic optical scheme of the high-power Cr:ZnSe tunable laser system 10. The pump 12 is a 50 W Tm fiber laser system. The pump laser can also be any CW fiber laser operating within 1550-1940 nm. Depending on the needed specification, they can be erbium fiber lasers (ELM/ELR systems available from IPG Photonics Corporation) for pumping Cr:ZnS gain medium or thulium fiber lasers (TLM/TLR lasers available from IPG Photonics Corporation) for both Cr:ZnS and Cr:ZnSe media. We have TLR-100-1908-WC lasers and TLM-100-1908-WC systems. Wavelength tuning is performed with highly-efficient diffraction grating 18 in Littrow configuration. FIG. 1 further provides lens 14 and 16 on either side of the Cr:ZnSe spinning ring gain element 10 and an output coupler 20. The input-output characteristics of the laser for two key output wavelengths, 2.45 μm and 2.94 μm, are shown in FIG. 2 along with images of beam profiles measured at 0.5 m from the output coupler 20 at the maximum pump power of 50 W.

Figure 2:
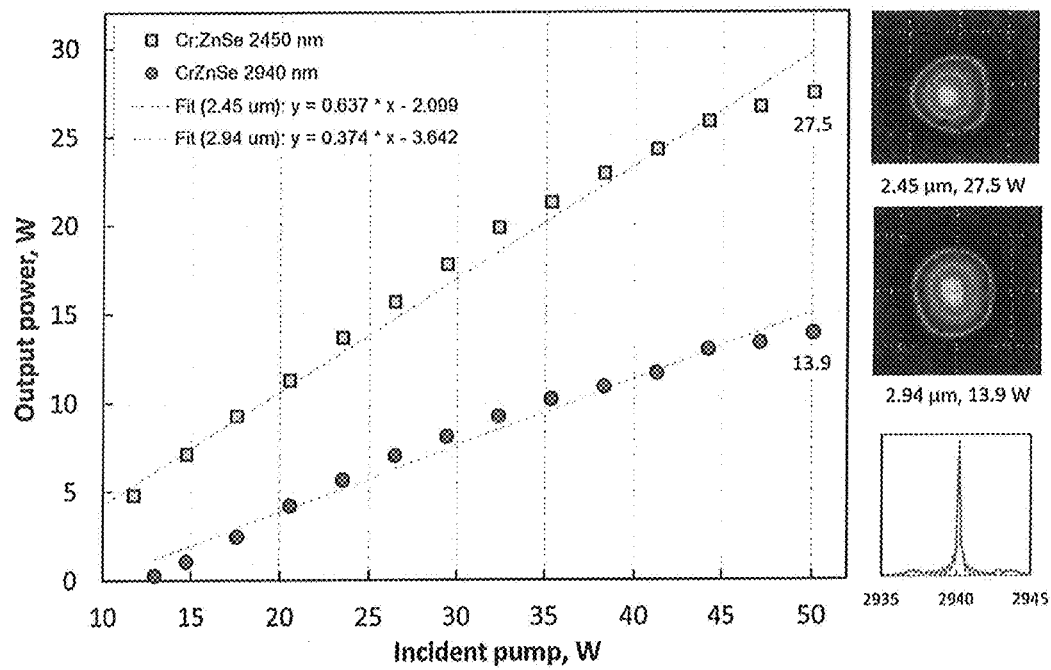
FIG. 2 provides input-output curves and beam profiles generated by the laser of FIG. 1.

The output spectrum at 2940 nm and maximum output power of 13.9 W is also shown in the insert of FIG. 2. The upper estimate of the output linewidth is less than 0.25 nm. The laser demonstrates pure CW output with maximum output power of 27.5 W at 2450 nm and 13.9 W at 2940 nm with average slope efficiencies of 63.7% and 37.4%, respectively.

Figure 3:
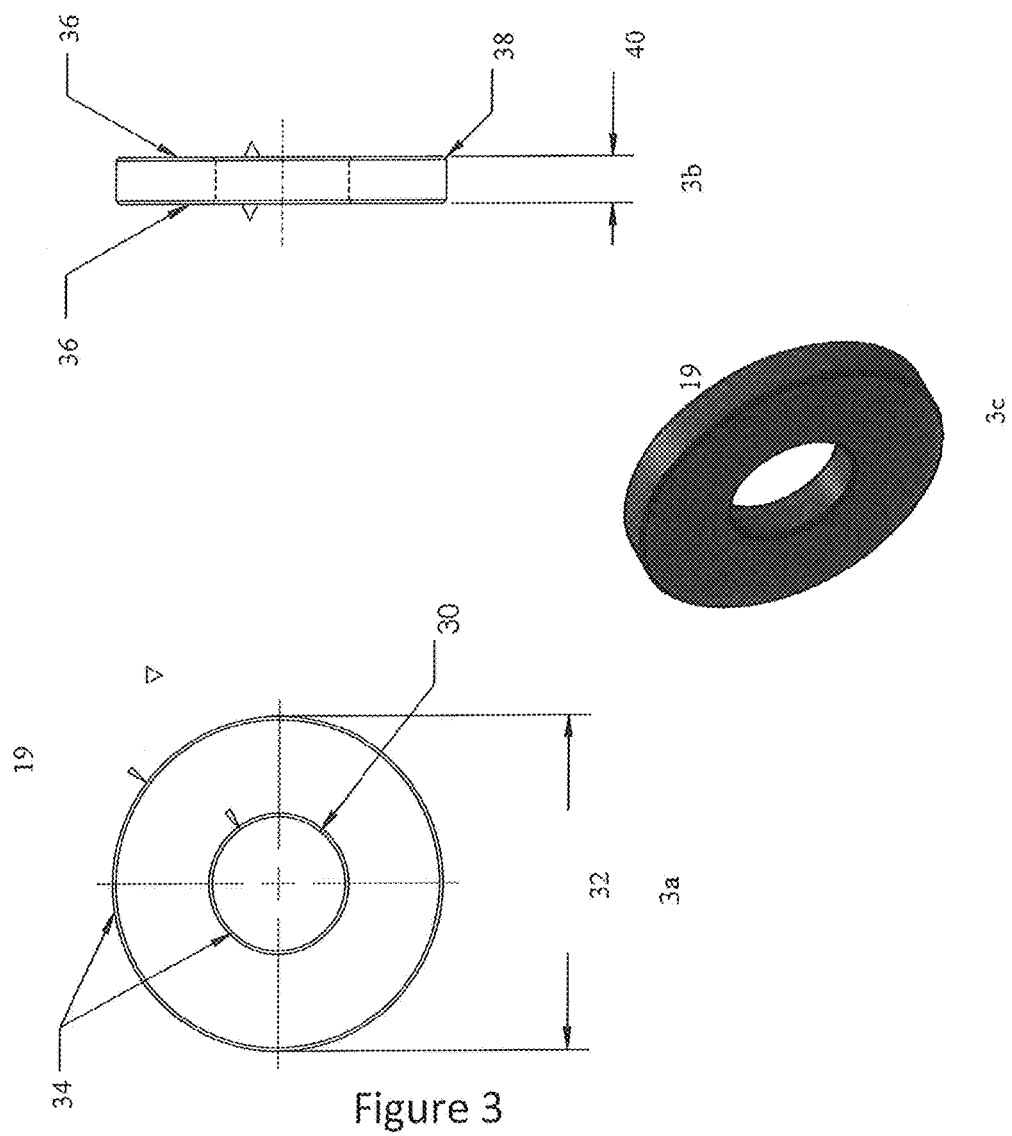
FIG. 3 provides various views of the chalcogenide gain media of the present invention.

FIG. 3 provides an example of a chalcogenide medium configured for the present invention.

FIG. 3a provides an upstream or downstream face view. For the experimental embodiment, the ring 19 had an inner circumference 30 and outer circumference 32 of 20 and 50 mm, respectively. Preferably, the outer diameter circumference 32 is in a range of 25 to 50 mm or more preferably less than 25 mm. The inner circumference 30 will vary as engineering requirements, such as motor mounts, require. The ring 19 further provides ground surfaces 34.

FIG. 3b sets forth a side view of the present invention, demonstrating the anti-reflective coatings 36 provided thereon. For the experimental version, the width 40 was 0.5 mm and a range of widths of 0.25 to 1.0 mm is contemplated. The ring 19 further provides a bevel 38. FIG. 3c provides an isometric view of the ring 19.

Regarding the RPM range: generally speaking, the RPM should be chosen as small as possible (for mechanical stability reasons) but must be sufficiently high to avoid thermal lensing effects. The RPM range will necessarily vary based upon the pump powers. Currently, we spin the 50-mm ring at 5000 RPM at 50 W pump power. The anticipated range of RPM for the rings is 500-10000 RPM depending on total pump power.

The experimental embodiment uses AR-coated Cr:ZnS/Se rings with normal incidence of the pump beam and laser mode. However, due to efficient elimination of the thermal lensing effects using this approach we might be able to use uncoated ring gain elements at Brewster angle of incidence. That will potentially allow for significant increase of cost efficiency.

With respect to pumping the gain media, Cr:ZnSe gain media is more suitable for pumping with Tm-fiber laser at 1908-1940 nm and have higher gain at longer wavelengths (e.g. 2.2-3.2 μm) and especially important for generation of 2.94 μm medical wavelength. The Cr:ZnS material is most suitable for pumping with Er-fiber lasers at 1550-1567 nm and has higher gain at shorter wavelengths (e.g 1.9-2.9 μm) and is also more suitable for high-power lasers operating near 2.4 μm.

Figure 4:
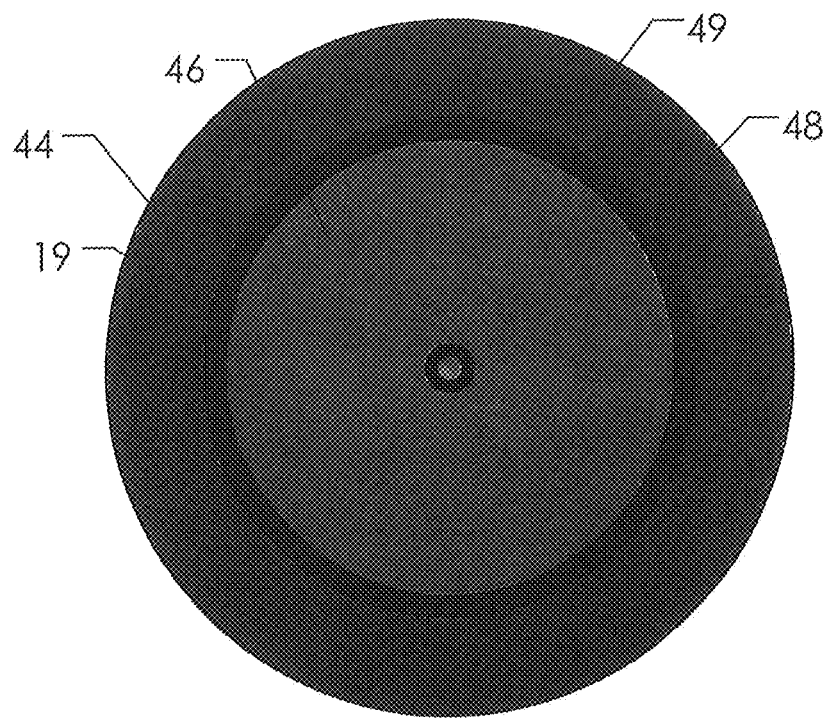
FIG. 4 is side view of a preferred embodiment of the ring including heatsinks and intermediate layers.

FIG. 4 provides a further embodiment of the present invention. The ring 19 is positioned between internal 48 and external 49 foils, in this case Indium. Preferably the Indium foil has a depth of 150 μm. These may be further sandwiched by external 44 and internal 46 heat sinks. Preferably all of the layers have an interference fit one to another so there are no gaps.

Figure 5:
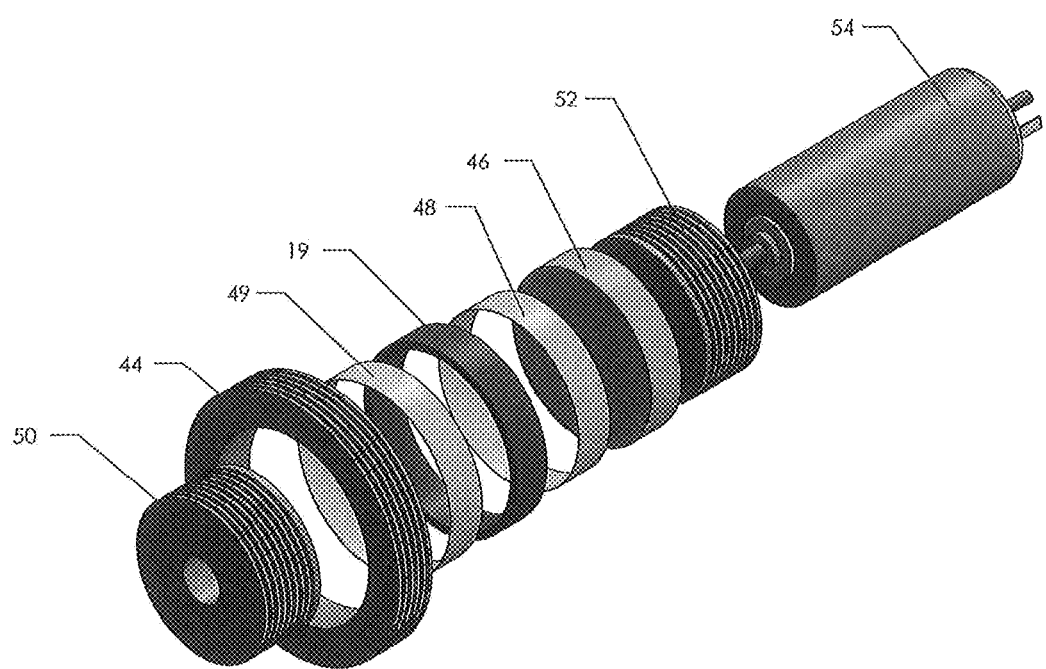
FIG. 5 provides an exploded three dimensional view of an assembly including the ring of the present invention.

FIG. 5 provides an exploded three dimensional view of the embodiment in FIG. 4 that further includes additional structures to provide sufficient cooling to all surfaces of the gain media. From left to right, a radiator 50 is enveloped by an external heat sink 44 while being fixed to the internal heat sink 46. The external heat sink 44 envelopes the external Indium foil 49 that sandwiches the ring 19 with an internal Indium foil 48 and an internal heat sink 46. A radiator 52 that facilitates removal of heat from the internal heat sink and CD/AC motor 54 for rotating the gain media completes the structure.

A variety of changes of the disclosed structure may be made without departing from the spirit and essential characteristics thereof. Thus, it is intended that all matter contained in the above description should be interpreted as illustrative only and in a limiting sense, the scope of the disclosure being defined by the appended claims.

The invention claimed is:

1. A continuous wave ("CW") mid-IR laser comprising:
a resonant cavity;
a gain medium selected from polycrystalline transition metal doped II-VI materials ("TM:II-VI), the gain medium being formed into a ring having an axis and defined by an inner and outer circumference and upstream and downstream faces with a portion of the upstream and downstream faces being positioned within the resonant cavity;
a ring-shaped heat sink concentric with the gain medium and spaced radially therefrom;
a pump source; and
a motor to which the ring is mounted; and whereby the portion of the ring being in the resonant cavity receives pump light sufficient to emit a CW laser beam at a wavelength in the mid-IR spectrum.

2. The CW laser of claim 1, wherein a face of the gain medium further comprises a reflective coating fixed thereto.

3. The CW laser of claim 1, wherein the gain medium is characterized as of Cr:ZnSe.

4. The CW laser of claim 1, wherein the gain medium is characterized as of Cr:ZnS.

5. The CW laser of claim 1 further comprising a foil positioned on a circumference.

6. The CW laser of claim 5, wherein the foil includes Indium.

7. The CW laser of claim 1 further comprising another ring-shaped heat sink concentric with the gain medium, wherein the heat sinks are spaced radially from one another facing respective inner and outer circumferences of the gain medium.

8. The CW laser of claim 7 further comprising spaced radially apart ring-shaped foils concentric with and located between respective heatsinks and internal and external circumferences of the gain medium.

9. The CW laser of claim 7 further comprising a radiator-concentric with the gain medium and heat sinks to facilitate heat removal therefrom.

* * * * *